(12) United States Patent
Katagiri et al.

(10) Patent No.: US 11,538,679 B2
(45) Date of Patent: Dec. 27, 2022

(54) SUBSTRATE PROCESSING METHOD AND SUBSTRATE PROCESSING APPARATUS

(71) Applicant: Tokyo Electron Limited, Tokyo (JP)

(72) Inventors: Yuji Katagiri, Kumamoto (JP); Kenji Sekiguchi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 865 days.

(21) Appl. No.: 16/334,430

(22) PCT Filed: Sep. 8, 2017

(86) PCT No.: PCT/JP2017/032555
§ 371 (c)(1),
(2) Date: Mar. 19, 2019

(87) PCT Pub. No.: WO2018/056085
PCT Pub. Date: Mar. 29, 2018

(65) Prior Publication Data
US 2021/0296123 A1 Sep. 23, 2021

(30) Foreign Application Priority Data

Sep. 21, 2016 (JP) .............................. JP2016-184404

(51) Int. Cl.
*H01L 21/02* (2006.01)
*H01L 21/67* (2006.01)

(52) U.S. Cl.
CPC .... *H01L 21/02348* (2013.01); *H01L 21/0206* (2013.01); *H01L 21/02343* (2013.01); *H01L 21/6715* (2013.01); *H01L 21/67115* (2013.01); *H01L 21/02118* (2013.01)

(58) Field of Classification Search
CPC ......... H01L 21/02348; H01L 21/67115; B08B 7/0057
See application file for complete search history.

(56) References Cited

U.S. PATENT DOCUMENTS

| | | | |
|---|---|---|---|
| 2002/0179852 A1* | 12/2002 | Zheng | G03F 7/70983 250/492.1 |
| 2007/0295355 A1* | 12/2007 | Ikuta | H01L 21/67028 134/1 |
| 2016/0365371 A1* | 12/2016 | Yao | B08B 15/00 |

FOREIGN PATENT DOCUMENTS

| | | |
|---|---|---|
| JP | 57-208157 A | 12/1982 |
| JP | 07-272993 A | 10/1995 |
| JP | 11-354621 A | 12/1999 |
| JP | 2001-293443 A | 10/2001 |
| JP | 2002-124502 A | 4/2002 |
| JP | 2005-197291 A | 7/2005 |

(Continued)

OTHER PUBLICATIONS

International Search Report dated Oct. 10, 2017 for WO 2018/056085 A1.

*Primary Examiner* — Natasha N Campbell
(74) *Attorney, Agent, or Firm* — Venjuris, P.C.

(57) ABSTRACT

A substrate processing method according to an embodiment includes a processing liquid supply step and an UV irradiation step. In the processing liquid supply step, a processing liquid is supplied to a substrate. In the UV irradiation step, the substrate after the processing liquid supply step is irradiated with ultraviolet rays having a wavelength of 200 nm or less, so that the substrate after the processing liquid supply step is destaticized.

7 Claims, 6 Drawing Sheets

(56) References Cited

FOREIGN PATENT DOCUMENTS

| | | |
|---|---|---|
| JP | 2008-506268 A | 2/2008 |
| JP | 2011-204944 A | 10/2011 |

* cited by examiner

SUBSTRATE PROCESSING METHOD AND SUBSTRATE PROCESSING APPARATUS

CROSS REFERENCE TO RELATED APPLICATIONS

This application is a national phase of PCT application No. PCT/JP2017/032555, filed on 8 Sep. 2017, which claims priority from Japanese Patent Application No. 2016-184404, filed on 21 Sep. 2016, all of which are incorporated herein by reference.

TECHNICAL FIELD

An embodiment disclosed herein relates to a substrate processing method and a substrate processing apparatus.

BACKGROUND

Conventionally, in a semiconductor device manufacturing process, a liquid processing is performed on a substrate by supplying a processing liquid to a substrate such as, for example, a semiconductor wafer (see, e.g., Patent Document 1).

PRIOR ART DOCUMENT

Patent Document

Patent Document 1: Japanese Patent Laid-Open Publication No. 2002-124502

SUMMARY OF THE INVENTION

Problem to be Solved

However, a substrate before and after a liquid processing may be electrified due to, for example, frictional electrification generated when the processing liquid flows on the surface of the substrate, and the electrification of the substrate may adversely affect the yield of products.

An aspect of an embodiment provides a substrate processing method and a substrate processing apparatus capable of destaticizing a substrate before and after a liquid processing.

Means to Solve the Problem

A substrate processing method according to an aspect of an embodiment includes a processing liquid supply step and an ultraviolet (UV) irradiation step. In the processing liquid supply step, a processing liquid is supplied to a substrate. In the UV irradiation step includes, the substrate is irradiated with ultraviolet rays having a wavelength of 200 nm or less before and/or after the processing liquid supply step, so that the substrate is destaticized.

Effect of the Invention

According to an aspect of an embodiment, it is possible to destaticize a substrate before and after a liquid processing.

DETAILED DESCRIPTION TO EXECUTE THE INVENTION

Hereinafter, embodiments of a substrate processing method and a substrate processing apparatus disclosed herein will be described in detail with reference to the accompanying drawings. However, the present disclosure is not limited by the embodiments described below.

Figure 1:
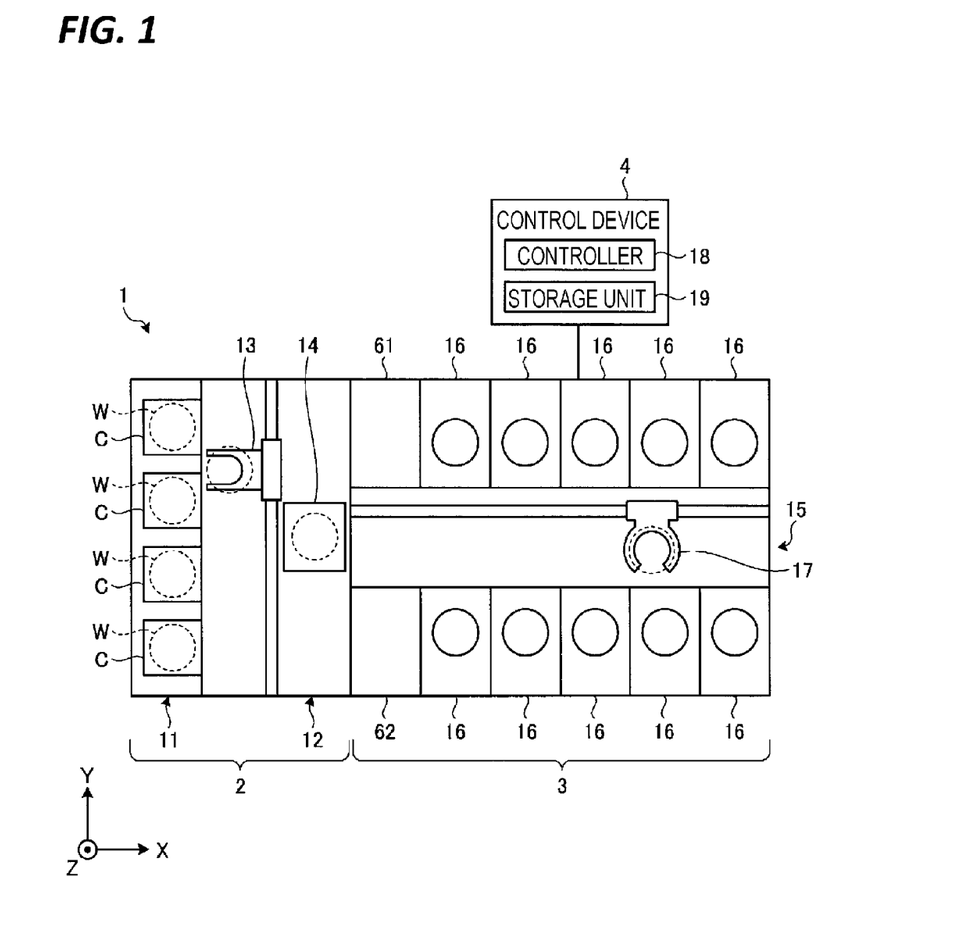
FIG. 1 is a view illustrating a schematic configuration of a substrate processing system according to an embodiment.

FIG. 1 is a view illustrating a schematic configuration of a substrate processing system according to an embodiment. In the following description, in order to clarify a positional relationship, an X axis, a Y axis, and a Z axis which are orthogonal to each other are defined, and the Z-axis positive direction is defined as a vertical upward direction.

As illustrated in FIG. 1, a substrate processing system 1 includes a carry-in/out station 2, and a processing station 3. The carry-in/out station 2 and the processing station 3 are provided adjacent to each other.

The carry-in/out station 2 includes a carrier placing section 11 and a transport section 12. A plurality of carriers C each configured to accommodate a plurality of semiconductor wafers W (hereinafter referred to as "wafers W") in a horizontal state are placed in the carrier placing section 11.

The transport section 12 is provided adjacent to the carrier placing section 11 and includes therein a substrate transport device 13 and a delivery unit 14. The substrate transport device 13 includes a wafer holding mechanism configured to hold a wafer W. In addition, the substrate transport device 13 is capable of moving in the horizontal direction and the vertical direction and rotating about the vertical axis, and transports a wafer W between a carrier C and the delivery unit 14 using the wafer holding mechanism.

The processing station 3 is provided adjacent to the transport section 12. The processing station 3 includes a transport section 15, a plurality of processing units 61, a pre-UV irradiation unit 61, and a post-UV irradiation unit 62. The plurality of processing units 16, the pre-UV irradiation unit, and the post-UV irradiation unit 62 are arranged along the transport section 15.

The arrangement and number of the pre-UV irradiation unit 61 and the post-UV irradiation unit 62 are not limited to those illustrated in the drawing. For example, the pre-UV irradiation unit 61 and the post-UV irradiation unit 62 may be arranged adjacent to each other, or a plurality of pre-UV irradiation units and post-UV irradiation units may be provided for the processing station 3.

The transport section 15 includes a substrate transport device 13 therein. The substrate transport device 17 includes a wafer holding mechanism configured to hold a wafer W. In addition, the substrate transport device 17 is capable of moving in the horizontal direction and the vertical direction and rotating about the vertical axis, and transports wafers W among the deliver unit 14, the processing unit 16, the pre-UV irradiation unit 61, and the post-UV irradiation unit 62.

The processing unit 16 performs a predetermined substrate processing on the wafers W transported by the substrate transport device 17. Specifically, in the substrate processing system 1 according to the present embodiment, by supplying a processing liquid to a wafer W after dry etching, a polymer removal processing (an example of a liquid processing) is performed to remove organic substance attached to the surface of the wafer W after etching (hereinafter, referred to as "polymer").

The pre-UV irradiation unit 61 performs destaticizing of the wafer W before the polymer removal processing of the polymer is performed by the processing unit 16. In addition, the post-UV irradiation unit 62 performs destaticizing of the wafer W after the polymer removal processing of the polymer is performed by the processing unit 16. The pre-UV irradiation unit 61 and the post-UV irradiation unit 62 correspond to examples of UV irradiation units.

In addition, the substrate processing system 1 includes a control device 4. The control device 4 is, for example, a computer, and includes a controller 18 and a storage unit 19. In the storage unit 19, a program for controlling various processings executed in the substrate processing system 1 is stored. The controller 18 controls the operation of the substrate processing system 1 by reading and executing the program stored in the storage unit 19.

The controller 18 is implemented by executing the program stored in the storage unit 19 by, for example, a central processing unit (CPU) or a micro processing unit (MPU) using the RAM as a work area. In addition, such a program may be recorded in a computer-readable storage medium and installed in the storage unit 19 of the control device 4 from the storage medium. Examples of computer-readable storage mediums include a hard disk (HD), a flexible disk (FD), a compact disk (CD), a magneto optical disk (MO), and a memory card. The control unit 18 may be implemented by integrated circuits such as, for example, an application specific integrated circuit (ASIC) and field programmable gate array (FPGA).

In the substrate processing system 1 configured as described above, first, the substrate transport device 13 of the carry-in/out station 2 takes out a wafer W from a carrier C placed on the carrier placing section 11 and places the taken-out wafer W on the delivery unit 14. The wafer W placed on the delivery unit 14 is taken out from the delivery unit 14 by the substrate transport device 17 in the processing station 3 and carried into the pre-UV irradiation unit 61.

The wafer W carried into the pre-UV irradiation unit 61 is destaticized by the pre-UV irradiation unit 61. The wafer W after destaticizing is carried out from the pre-UV irradiation unit 61 by the substrate transport device 17 and carried into a processing unit 16. After being subjected to a liquid processing by the processing unit 16, the wafer W carried into the processing unit 16 is carried out from the processing unit 16 by the substrate transport device 17 and carried to the post-UV irradiation unit 62.

The wafer W carried into the post-UV irradiation unit 62 is destaticized by the post-UV irradiation unit 62. The wafer W after destaticizing is carried out from the post-UV irradiation unit 62 by the substrate transport device 17 and carried into the delivery unit 14. The wafer W completely processed and placed on the deliver unit 14 is returned to a carrier C in the carrier placing section 11 by the substrate transport device 13.

In this way, in the substrate processing system 1 according to the present embodiment, the wafer W after the liquid processing is destaticized and then returned to the carrier C. This makes it possible to suppress a decrease in yield due to the electrification of the wafer W after the liquid processing.

In the substrate processing system 1, it is also assumed that the wafer W before the liquid processing is also destaticized. This makes it possible to suppress damages (electrostatic breakdown) that the wafer W receives when the processing liquid comes into contact with the wafer W during the liquid processing.

Figure 2:
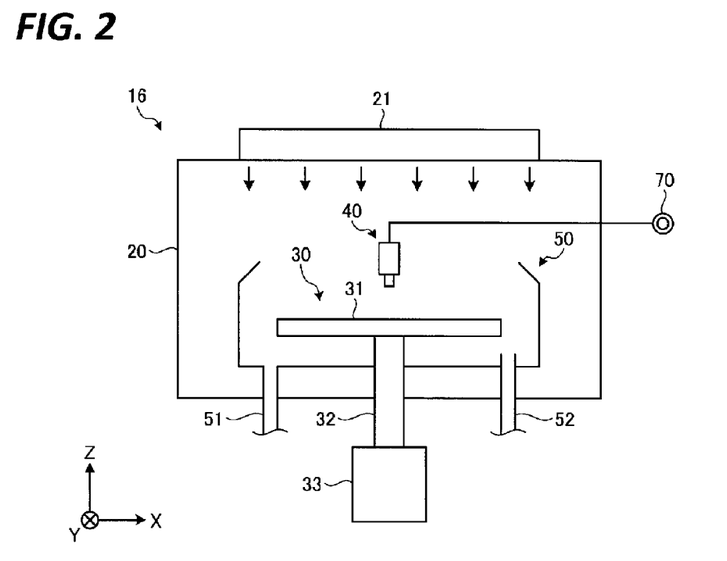
FIG. 2 is a view illustrating a schematic configuration of a processing unit.

Next, the configuration of the liquid processing unit 16 will be described with reference to FIG. 2. FIG. 2 is a view illustrating a schematic configuration of a processing unit 16.

As illustrated in FIG. 2, the processing unit 16 includes a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A ceiling portion of the chamber 20 is provided with a fan filter unit (FFU) 21. The FFU 21 forms a down flow within the chamber 20.

The substrate holding mechanism 30 includes a holding unit 31, a support 32, and a drive unit 33. The holding unit 31 holds a wafer W horizontally. The support 32 is a member extending in the vertical direction. The support is rotatably supported by the drive unit 33 at the base end portion thereof and horizontally supports the holding unit 31 on the tip end thereof. The drive unit 33 rotates the support 32 about the vertical axis. The substrate holding mechanism 30 rotates the holding unit 31 supported on the support 32 by rotating the support 32 using the drive unit 33, thereby rotating the wafer W held on the holding unit 31.

The processing fluid supply unit 40 supplies a processing fluid to the wafer W. The processing fluid supply unit 40 is connected to a processing fluid supply source 70.

The recovery cup 50 is disposed so as to surround the holding unit 31 and collects the processing liquid scattered from the wafer W by the rotation of the holding unit 31. A drain port 51 is formed in the bottom portion of the recovery cup 50, and the processing liquid collected by the recovery cup 50 is discharged from the drain port 51 to the outside of the processing unit 16. In addition, in the bottom portion of the recovery cup 50, an exhaust port 52 is formed to discharge the gas supplied from the FFU 21 to the outside.

The processing unit 16 according to the present embodiment performs a polymer removal processing for removing the polymer attached to the surface of the wafer W after dry etching. Specifically, the processing fluid supply unit 40 of the processing unit 16 is connected to a dilute hydrofluoric acid (DHF) supply source as the processing fluid supply source 70. The processing unit 16 removes the polymer attached to the surface of the wafer W by supplying DHF from the processing fluid supply unit 40 to the wafer W held by the holding unit 31 and rotated by the driving unit 33.

In addition, the processing fluid supply unit 40 of the processing unit 16 is connected to a DIW (pure water at room temperature) supply source as the processing fluid supply source 70. Then, the processing unit 16 also performs a rinsing process of replacing DHF on the wafer W with DIW by supplying the DIW from the processing fluid supply unit 40 to the wafer W after supplied with the DHF.

The processing fluid supply unit 40 includes, for example, a nozzle, an arm that horizontally supports the nozzle, and a rotating and lifting mechanism that rotates the arm and moves the arm up and down. The processing fluid supply unit 40 may include a nozzle that supplies DHF and a nozzle that supplies DIW, or may include a single nozzle that supplies DHF and DIW. The processing liquid supplied from the processing fluid supply unit 40 is not limited to DHF and may be, for example, ammonium fluoride, hydrochloric acid, sulfuric acid, hydrogen peroxide water, phosphoric acid, acetic acid, nitric acid, ammonium hydroxide, an organic acid, or an aqueous solution containing at least one or more of them.

Figure 3:
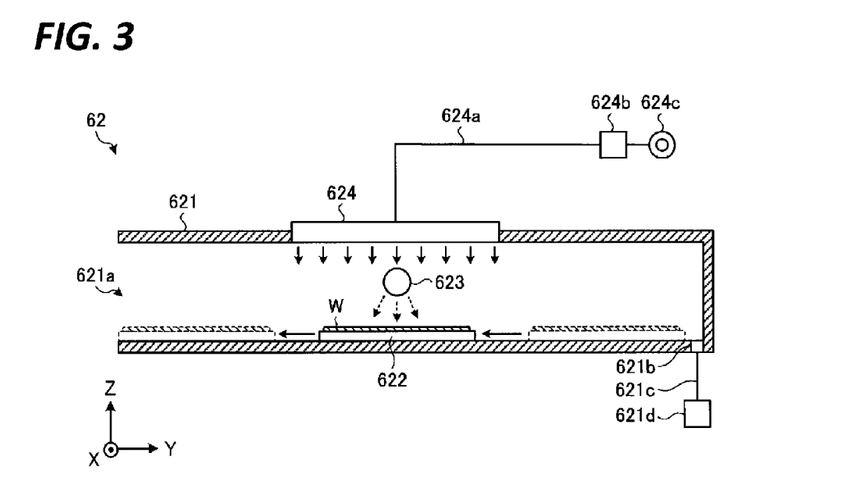
FIG. 3 is a view illustrating a schematic configuration of a post UV irradiation unit.

Next, the configurations of the pre-UV irradiation unit 61 and the post-UV irradiation unit 62 will be described. In the present embodiment, since the pre-UV irradiation unit 61 and the post-UV irradiation unit 62 have the same configuration, here, the configuration of the post-UV irradiation unit 62 will be described with reference to FIG. 3, and a description of the configuration of the pre-UV irradiation unit 61 will be omitted. FIG. 3 is a view illustrating a schematic configuration of a post UV irradiation unit 62.

As illustrated in FIG. 3, the post-UV irradiation unit 62 includes, for example, a chamber 621, a moving stage 622, an UV irradiation part 623, and an inert gas supply unit 624.

The chamber 621 is, for example, an open type container having an opening 621a on the side of the transport section 15. An exhaust port 621b is formed in the chamber 621, and an exhaust device 621d is connected to the exhaust port 621b via an exhaust pipe 621c.

The moving stage 622 is configured to be movable in the depth direction (Y-axis direction) of the chamber 621. An UV irradiation part 623 and an inert gas supply unit 624 are arranged above the movement path of the moving stage 622. The UV irradiation part 623 is, for example, a UV lamp and irradiates a wafer W placed on the moving stage 622 with ultraviolet rays.

The inert gas supply unit 624 supplies an inert gas around the UV irradiation part 623. Specifically, a supply pipe 624a is connected to the inert gas supply unit 624, and a flow rate adjustment mechanism 624b and an inert gas supply source 624c are connected to the supply pipe 624a. The inert gas supply source 624c supplies an inert gas to the supply pipe 624a. In the present embodiment, the inert gas supply source 624c supplies nitrogen as the inert gas. The flow rate adjustment mechanism 624b is configured to include, for example, a valve and a flow rate adjustment valve, and adjusts the flow rate of nitrogen flowing through the supply pipe 624a.

In the post-UV irradiation unit 62, first, a wafer W is moved from the front side of the chamber 621 (the opening 621a side) using the moving stage 622 to the deep side after passing through the UV irradiation part 623. Meanwhile, by supplying nitrogen into the chamber 621 from the inert gas supply unit 624 while evacuating the inside of the chamber 621 using the exhaust device 621d, at least the atmosphere of a region irradiated with UV rays from the UV irradiation part 623 inside the post-UV irradiation unit 62 is replaced from an air atmosphere to a nitrogen atmosphere.

Subsequently, when the replacement to the nitrogen atmosphere is completed, irradiation with UV rays by the UV irradiation part 623 is started. Then, by moving the wafer W from the deep side to the front side of the chamber 621 using the moving stage 622, the wafer W on the moving stage 622 is irradiated with UV rays. When the wafer W is irradiated with UV rays, the wafer W is destaticized by an electron emission action due to the photon absorption of UV rays.

Here, when the wafer W is irradiated with UV rays having a wavelength exceeding 200 nm, it is possible to destaticize a positively electrified wafer portion. However, it is impossible to destaticize a negatively electrified wafer portion, and even if it is possible, it takes a long time to properly destaticize the negatively electrified wafer portion. In this way, when UV rays having a wavelength exceeding 200 nm are used, it is difficult to properly destaticize the wafer W.

Therefore, in the post-UV irradiation unit 62 according to the present embodiment, the wafer W is irradiated with UV rays having a wavelength of 200 nm or less. This makes it possible to properly destaticize both the positively electrified wafer portion and the negatively electrified wafer portion.

Figure 4:
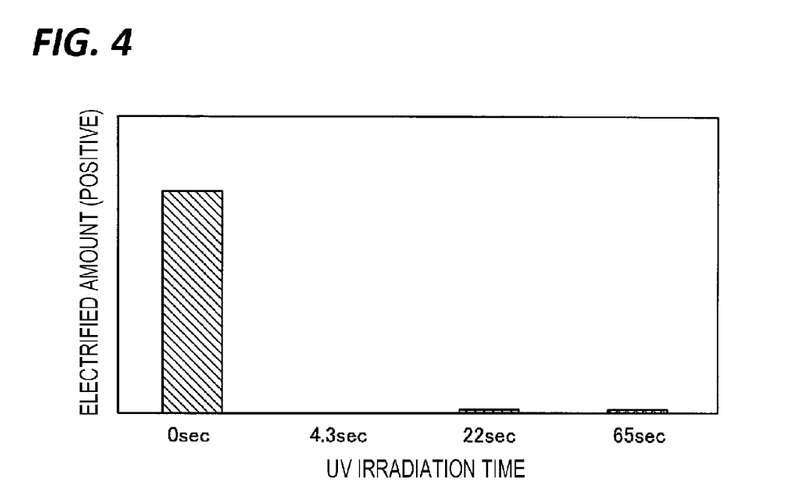
FIG. 4 is a graph representing a destaticizing effect on a positively electrified wafer.
Figure 5:
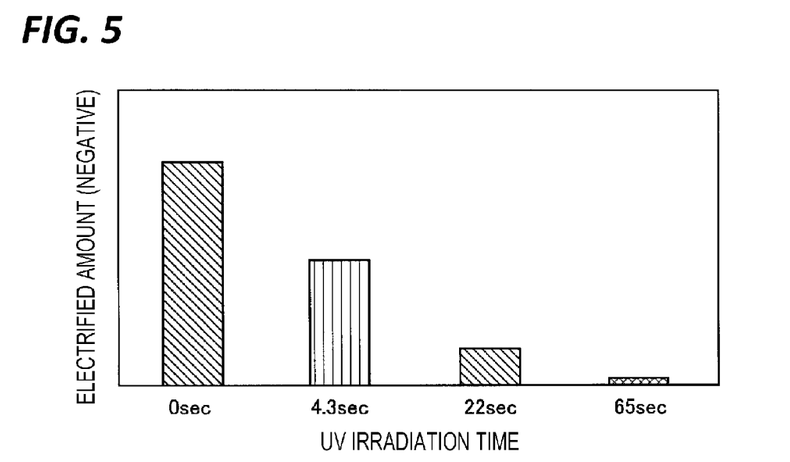
FIG. 5 is a graph representing a destaticizing effect on a negatively electrified wafer.

This point will be described with reference to FIGS. 4 and 5. FIG. 4 is a graph representing a destaticizing effect on a positively electrified wafer portion. In addition, FIG. 5 is a graph representing a destaticizing effect on a positively electrified wafer portion. FIGS. 4 and 5 represent changes in the electrified amount of a wafer W when the wafer W was irradiated with UV rays having a wavelength of 172 nm under a nitrogen atmosphere. In the graphs illustrated in FIGS. 4 and 5, the vertical axis represents the electrified amount (V) of the wafer W, and the horizontal axis represents an irradiation time (sec) with UV rays.

As illustrated in FIGS. 4 and 5, it can be seen that by being irradiated with UV rays having a wavelength of 172 nm under a nitrogen atmosphere, the electrified amount of either the positively electrified wafer portion or the negatively charged wafer portion is reduced. Specifically, the electrified amount of the positively charged wafer portion is reduced by almost 100% by being irradiated with UV rays having a wavelength of 172 nm for 4.3 sec (0.08 J/cm$^2$ when converted to an irradiation amount). In addition, the electrified amount of the negatively electrified wafer portion is reduced by about 50% when the negatively electrified wafer portion is irradiated with UV rays having a wavelength of 172 nm for 4.3 sec, reduced by about 85% when irradiated for 22 sec (0.4 J/cm$^2$), and reduced by about 95% when irradiated for 65 sec (1.2 J/cm$^2$).

FIGS. 4 and 5 represent the destaticizing effect when a wafer W was irradiated with UV rays having a wavelength of 172 nm or less, but it is possible to obtain the same destaticizing effect in the case of irradiation with UV rays having a wavelength of more than 172 nm and 200 nm or less.

Meanwhile, UV rays having a short wavelength of 200 nm or less dissociate oxygen molecules ($O_2$), and dissociated oxygen molecules are combined with other oxygen molecules to generate ozone ($O_3$). Ozone ($O_3$) may damage, for example, a low-k film (organic film) on a wafer W.

Therefore, in the post-UV irradiation unit 62 according to the present embodiment, the wafer W is irradiated with UV rays having a wavelength of 200 nm or less.

Figure 6:
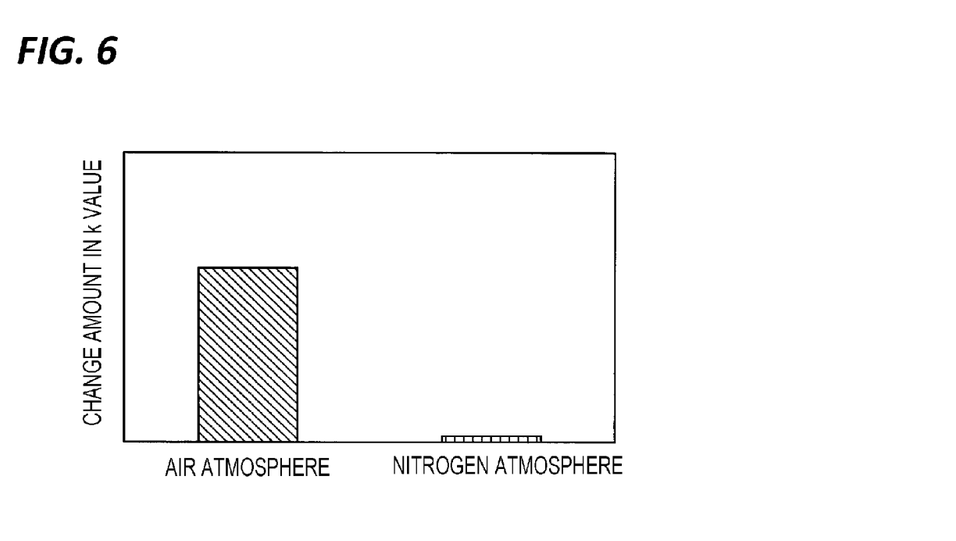
FIG. 6 is a graph representing the comparison of damages to low-k films when the low-k films on a wafer were irradiated with UV rays having a wavelength of 172 nm under an air atmosphere and under a nitrogen atmosphere.

FIG. 6 is a graph representing the comparison of damages to low-k films when the low-k films on a wafer W were irradiated with UV rays having a wavelength of 172 nm under an air atmosphere and under a nitrogen atmosphere. The vertical axis of the graph illustrated in FIG. 6 represents a change amount (an increase amount) in the dielectric constant (k value) of a low-k film, and represents that the larger the change amount in the k value, the greater the damage to the low-k film.

As illustrated in FIG. 6, it can be seen that the change amount in the k value, that is, the damage to the low-k film, is higher in the case of irradiation with UV rays having a wavelength of 172 nm in the nitrogen atmosphere than in the case of irradiation with UV rays in the air atmosphere.

In this way, through irradiation with UV rays having a wavelength of 200 nm or less in the nitrogen atmosphere, that is, in an environment with a low oxygen concentration compared with the air atmosphere, it is possible to destaticize the wafer W while suppressing a damage to the wafer W due to ozone.

The pre-UV irradiation unit 61 has the same configuration as the post-UV irradiation unit 62 illustrated in FIG. 3, and irradiates a wafer W before a liquid processing with UV rays having a wavelength of 200 nm or less under a nitrogen atmosphere. This makes it possible to destaticize the wafer W before liquid processing while suppressing a damage to the wafer W due to ozone.

In addition, ozone generated by irradiation with UV rays modifies (oxidizes) a polymer on the wafer W. Thereby, the pre-UV irradiation unit 61 is capable of improving the polymer removal efficiency in the liquid processing (polymer removal processing) performed in the subsequent processing unit 16. In other words, it is possible to shorten the time required for the polymer removal processing. Also, it is possible to reduce the consumption of a processing liquid in the polymer removal processing.

In the substrate processing system 1 according to the present embodiment, the concentration of the nitrogen atmosphere in the pre-UV irradiation unit 61 is set to be lower than the concentration of the nitrogen atmosphere in the post-UV irradiation unit 62. Specifically, the control device 4 adjusts the supply flow rate of nitrogen by the inert gas supply unit 624 such that the oxygen concentration in the chamber 621 of the pre-UV irradiation unit 61 is higher than the oxygen concentration in the chamber 621 of the post-UV irradiation unit 62 by controlling the flow rate adjustment mechanism 624b of the pre-UV irradiation unit 61 or the post-UV irradiation unit 62. In detail, the control device 4 causes the supply flow rate of nitrogen supplied by the inert gas supply unit 624 of the pre-UV irradiation unit 61 to be lower than the supply flow rate of nitrogen supplied by the inert gas supply unit 624 of the post-UV irradiation unit 62.

Figure 7:
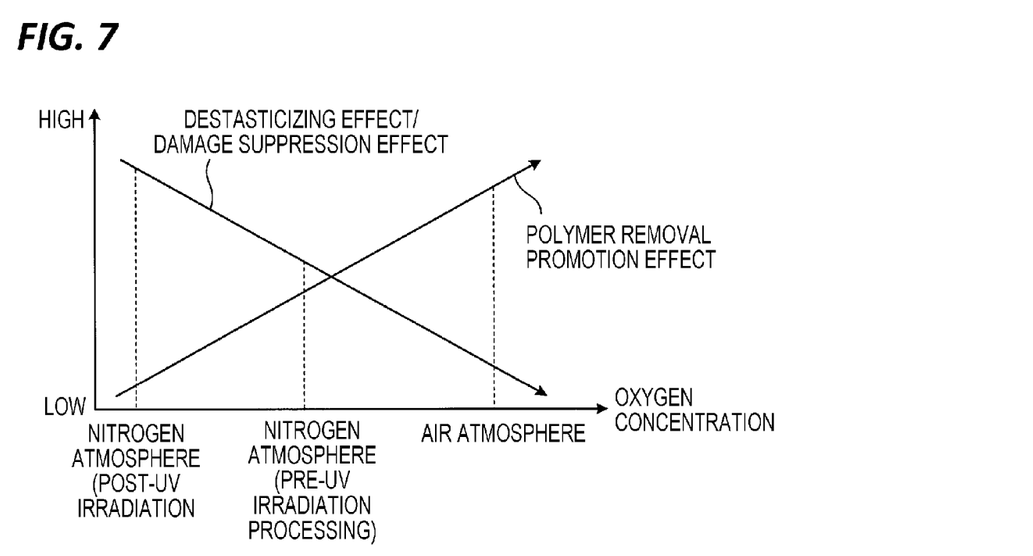
FIG. 7 is a graph representing a relationship between a destaticizing effect, a wafer damage suppression effect, and a polymer removal promotion effect by UV rays having wavelengths of 200 nm or less, and an oxygen concentration.

This point will be described with reference to FIG. 7. FIG. 7 is a graph representing a relationship between a destaticizing effect, a wafer W damage suppression effect, and a polymer removal promotion effect by UV rays having a wavelength of 200 nm or less, and an oxygen concentration.

As illustrated in FIG. 7, the destaticizing effect and the effect of suppressing a damage to the wafer W by ozone (the damage suppression effect) become lower as the oxygen concentration becomes higher, in other words, the nitrogen concentration becomes lower. This is because, as for the destaticizing effect, as the oxygen concentration increases, the amount of UV rays absorbed by oxygen increases, and as for the damage suppression effect, as the oxygen concentration increases, more ozone is generated.

Meanwhile, the effect of improving the polymer removal efficiency (the polymer removal promotion effect) decreases as the oxygen concentration decreases, in other words, the nitrogen concentration increases. This is because as the oxygen concentration decreases, the amount of generated ozone decreases, and the effect of modifying the polymer on the wafer W is reduced.

Since the post-UV irradiation unit 62 destaticizes the wafer W after the polymer removal processing, the polymer removal promotion effect may be low. In contrast, since the pre-UV irradiation unit 61 destaticizes the wafer W before the polymer removal processing, the polymer removal promotion effect may be high.

For this reason, in the substrate processing system 1 according to the present embodiment, in the pre-UV irradiation processing performed by the pre-UV irradiation unit 61, a wafer W before the polymer removal processing is irradiated with UV rays having a wavelength of 200 nm or more under the nitrogen atmosphere, the concentration of which is lower than that of the nitrogen atmosphere in the post-UV irradiation processing performed by the post-UV irradiation unit 62.

Figure 8:
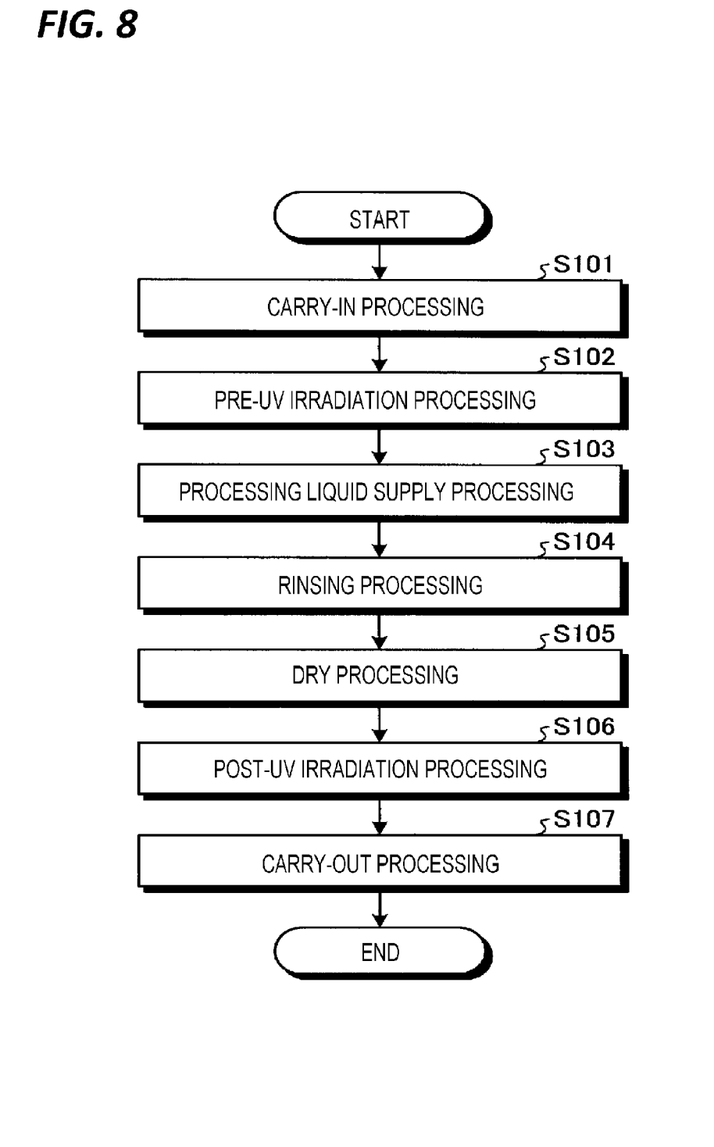
FIG. 8 is a flowchart illustrating a processing procedure of a substrate processing according to the present embodiment.

Next, a specific operation of the substrate processing system 1 according to the present embodiment will be described with reference to FIG. 8. FIG. 8 is a flowchart illustrating a processing procedure of a substrate processing according to the present embodiment. Each processing procedure illustrated in FIG. 8 is performed under the control of the control device 4.

As illustrated in FIG. 8, in the substrate processing system 1, a carry-in processing of a wafer W is performed (step S101). Specifically, the substrate transport device 13 of the carry-in/out station 2 takes out a wafer W from a carrier C placed on the carrier placing section 11, and places the taken-out wafer W on the delivery unit 14. Thereafter, the substrate transport device 17 of the processing station 3 takes out the wafer W from the delivery unit 14, and places the wafer on the moving stage 622 (see, e.g., FIG. 3) of the pre-UV irradiation unit 61.

In addition, the wafer W carried into the pre-UV irradiation unit 61 by the carry-in processing is a wafer W after subjected to a dry etching processing by an etching device (not illustrated).

Subsequently, in the substrate processing system 1, a pre-UV irradiation processing is performed in the liquid processing system 1 (step S102). The wafer W subjected to the dry etching processing is electrified. In the pre-UV irradiation processing, the wafer W after the dry etching processing and before the liquid processing is irradiated with UV rays having a wavelength of 200 nm or less under a nitrogen atmosphere. As a result, the wafer W after the dry etching processing and before the liquid processing is destaticized. Thus, it is possible to suppress damages (electrostatic breakdown) that the wafer W receives when the processing liquid comes into contact with the wafer W in the processing liquid supply processing in the subsequent stage. In addition, since the polymer on the wafer W is modified by the UV rays, it is possible to improve the polymer removal efficiency in the processing liquid supply processing in the subsequent stage.

After the pre-UV irradiation processing, the wafer W is taken out from the pre-UV irradiation unit 61 by the substrate transport device 17, and then placed on and held by the holding unit 31 of the processing unit 16. Thereafter, the processing unit 16 rotates the holding unit 31 at a predetermined rotation speed (e.g., 50 rpm).

Subsequently, in the processing unit 16, a processing liquid supply processing is performed (step S103). In the processing liquid supply processing, DHF is supplied from the processing fluid supply unit 40 to the surface of the wafer W. The DHF supplied to the wafer W is spread on the surface of the wafer W by the centrifugal force accompanying the rotation of the wafer W. As a result, the polymer on the wafer W is removed.

In the substrate processing system 1, since the polymer is modified by the pre-UV irradiation processing to be turned into an easily removable state, it is possible to shorten the time required for removing the polymer. That is, it is possible to shorten the processing time of the processing liquid supply processing. In addition, it is possible to reduce the consumption of DHF by shortening the processing time.

Upon completion of the processing liquid supply processing in step S103, a rinsing processing is performed in the processing unit 16 (step S104). In the processing liquid supply processing, DIW serving as a rinsing liquid is supplied from the processing fluid supply unit 40 to the surface of the wafer W. The DIW supplied to the wafer W is spread on the surface of the wafer W by the centrifugal force accompanying the rotation of the wafer W. As a result, the DHF remaining on the wafer W is washed out by the DIW.

Subsequently, in the processing unit 16, a dry processing is performed (step S105). In this dry processing, the wafer W is rotated at a predetermined rotation speed (e.g., 1,000 rpm) for a predetermined time. As a result, the DIW remaining on the wafer W is spun off, and thus the wafer W is dried. Thereafter, the rotation of the wafer W is stopped.

After the dry processing, the wafer W is taken out from the processing unit 16 by the substrate transport device 17 and then placed on the moving stage 622 of the post-UV irradiation unit 62. Thereafter, in the substrate processing system 1, a post-UV irradiation processing is performed in the liquid processing system 1 (step S106). During the dry processing, the DIW remaining on the wafer W is spun off, and thus the wafer W is electrified. In this case, both a positively electrified wafer portion and a negatively electrified wafer portion are present in the wafer W. In the post-UV irradiation processing, after the liquid processing (a processing liquid supply processing and a rinsing processing), more specifically, after a dry processing, the wafer W is irradiated with UV rays having a wavelength of 200 nm or less under a nitrogen atmosphere.

As a result, the wafer W after the liquid processing is destaticized. Thus, it is possible to suppress a decrease in yield due to the electrification of the wafer W after the liquid processing. In addition, in the post-UV irradiation unit 62 according to the present embodiment, since irradiation is performed with UV rays having a wavelength of 200 nm or less, it is possible to properly destaticize both the positively electrified wafer portion and the negatively electrified wafer portion. In addition, in the post-UV irradiation unit 62 according to the present embodiment, since UV rays having a wavelength of 200 nm or less are irradiated under a nitrogen atmosphere, it is possible to destaticize the wafer W while suppressing the damage to the wafer W by ozone.

Subsequently, in the substrate processing system 1, a carry-out processing is performed (step S107). In the carry-out processing, the substrate transport device 17 takes out the wafer W from the moving stage 622 of the post-UV irradiation unit 62, and places the wafer W on the delivery unit 14. Thereafter, the substrate transport device 13 takes out the wafer W from the delivery unit 14, and stores the wafer in a carrier C in the carrier placing section 11. Upon completion of the carry-out processing, the substrate processing for one wafer W is completed.

Figure 9:
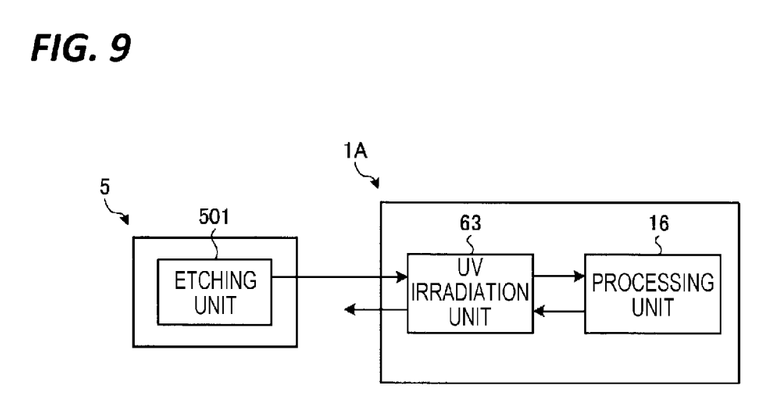
FIG. 9 is a view representing a schematic configuration of a substrate processing system according to a first modification.
Figure 10:
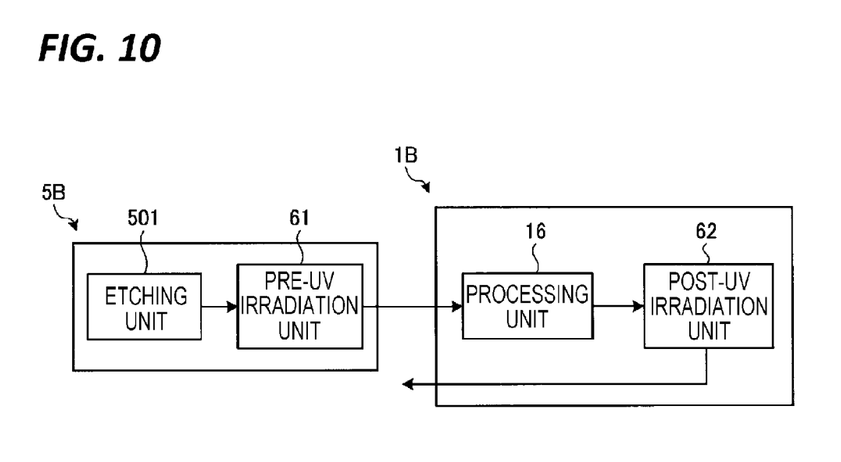
FIG. 10 is a view representing a schematic configuration of a substrate processing system according a second modification.

Next, a modification to the liquid processing system 1 will be described with reference to FIGS. 9 and 10. FIG. 9 is a view representing a schematic configuration of a substrate processing system according to a first modification. In addition, FIG. 10 is a view representing a schematic configuration of a substrate processing system according to a second modification.

In the above-described embodiment, an example has been described in which the substrate processing system 1 includes the pre-UV irradiation unit 61 that performs a pre-UV irradiation processing and a post-UV irradiation unit 62 that performs a post-UV irradiation processing. However, the present disclosure is not limited to this, and the substrate processing system may perform both the pre-UV irradiation processing and the post-UV irradiation processing using a single UV irradiation unit.

For example, as illustrated in FIG. 9, instead of the pre-UV irradiation unit 61 and the post-UV irradiation unit 62, the substrate processing system 1A according to a first modification includes an UV irradiation unit 63 (an example of an UV irradiation part) having a configuration similar to those of the pre-UV irradiation unit 61 and the post-UV irradiation unit 62.

The UV irradiation unit 63 irradiates a wafer W subjected to a dry etching by the etching unit 501 of the etching apparatus 5 with UV rays having a wavelength of 200 nm or less under a nitrogen atmosphere, thereby destaticizing the wafer W before a liquid processing. In addition, the UV irradiation unit 63 irradiates a wafer W subjected to a liquid processing with UV rays having a wavelength of 200 nm or less under a nitrogen atmosphere, thereby destaticizing the wafer W after the liquid processing.

In the UV irradiation unit 63, the supply flow rate of nitrogen is controlled such that the concentration of the nitrogen atmosphere in the pre-ultraviolet IR processing is lower than the concentration of the nitrogen atmosphere in the post-UV irradiation processing. That is, the UV irradiation unit 63 makes the oxygen concentration in the UV irradiation unit 63 in the pre-UV irradiation processing higher than the oxygen concentration in the UV irradiation unit 63 in the post-UV irradiation treatment.

In addition, as illustrated in FIG. 10, of the pre-UV irradiation unit 61 and the post-UV irradiation unit 62, the pre-UV irradiation unit 61 may be provided in an etching apparatus 5B. In this case, the wafer W destaticized by the pre-UV irradiation unit 61 is carried into a substrate processing system 1B, and a liquid processing by the processing unit 16 and a post-UV irradiation processing by the post-UV irradiation unit 62 are performed in the substrate processing system 1B.

In addition, in the above-described embodiments and modifications, a description has been made on an example in which a pre-UV irradiation processing and a post-UV irradiation processing are performed on a wafer W after the dry etching. However, a wafer to be subjected to a pre-UV irradiation processing and a post-UV irradiation treatment is not limited to a wafer W after the dry etching.

In the above-described embodiments and modifications, nitrogen is used as an inert gas in the pre-UV irradiation processing and the post-UV irradiation processing. However, the inert gas is not limited to nitrogen, but may be, for example, argon or helium.

In the above-described embodiments and modifications, the oxygen concentration is reduced by replacing an air atmosphere with an inert gas atmosphere in the pre-UV irradiation processing and the post-UV irradiation processing. However, a method of reducing the amount of oxygen may be used. For example, in the case where the pre-UV irradiation unit 61 and the post-UV irradiation unit 62 include a closed type chamber, the amount of oxygen in the chamber may be reduced by reducing the pressure in the chamber using a decompressing device such as, for example, a vacuum pump.

As described above, the substrate processing system 1 (an example of a substrate processing apparatus) according to the embodiment includes a processing unit 16 (an example of a processing liquid supply unit) and a post-UV irradiation unit 62 (an example of an UV irradiation part). The processing unit 16 supplies DHF (an example of a processing liquid) to a wafer W (an example of a substrate). The post-UV irradiation unit 62 irradiates the wafer W which has been supplied with DHF by the processing unit 16 with UV rays having a wavelength of 200 nm or less, thereby destaticizing the wafer W which has supplied with the DHF.

Therefore, with the substrate processing system 1 according to the embodiment, it is possible to destaticize a substrate before and after a liquid processing.

Additional effects and variations can be easily derived by a person ordinarily skilled in the art. Thus, the broader aspects of the present disclosure are not limited to specific details and representative embodiments illustrated and described above. Accordingly, various modifications can be made without departing from the spirit or scope of the general inventive concept defined by the appended claims and the equivalents thereof.

DESCRIPTION OF SYMBOLS

10: substrate processing system
16: processing unit
61: pre-UV irradiation unit
62: post-UV irradiation unit
621: chamber
622: moving stage
623: UV irradiation part
624: inert gas supply unit

The invention claimed is:

1. A substrate processing method comprising:
    supplying a processing liquid to a substrate;
    first irradiating the substrate with ultraviolet rays having a wavelength of 200 nm or less before the supplying under a first inert gas atmosphere having a first oxygen concentration so that the substrate is destaticized; and
    second irradiating the substrate with ultraviolet rays having a wavelength of 200 nm or less after the supplying under a second inert gas atmosphere having a second oxygen concentration lower than the first oxygen concentration so that an ozone damage on the substrate is suppressed and the substrate is destaticized.

2. The substrate processing method of claim 1, wherein the first irradiating is performed in a first irradiation chamber and the second irradiating is performed in a second irradiation chamber, each irradiation chamber including a first side having an opening and a second side opposite the first side.

3. The substrate processing method of claim 2, wherein, in the first irradiating, the substrate is horizontally moved between the first side and the second side of the first irradiation chamber, and
    in the second irradiating, the substrate is horizontally moved between the first side and the second side of the second irradiation chamber.

4. The substrate processing method of claim 2, wherein, the first inert gas atmosphere is provided by supplying an inert gas to the first irradiation chamber while evacuating an inside of the first irradiation chamber, and
    the second inert gas atmosphere is provided by supplying the inert gas to the second irradiation chamber while evacuating an inside of the second irradiation chamber.

5. The substrate processing method of claim 1, wherein the first irradiating and the second irradiating are performed in an irradiation chamber including a first side having an opening and a second side opposite the first side.

6. The substrate processing method of claim 5, wherein, in the first irradiating and the second irradiating, the substrate is horizontally moved between the first side and the second side of the irradiation chamber.

7. The substrate processing method of claim 5, wherein, the first inert gas atmosphere and the second inert gas atmosphere are provided by supplying an inert gas to the irradiation chamber while evacuating an inside of the irradiation chamber.

\* \* \* \* \*